United States Patent [19]

Stein

[11] Patent Number: 5,211,801
[45] Date of Patent: May 18, 1993

[54] METHOD FOR MANUFACTURING SINGLE-CRYSTAL SILICON CARBIDE

[75] Inventor: René Stein, Röttenbach, Fed. Rep. of Germany

[73] Assignee: Siemens Aktiengesellschaft, Munich, Fed. Rep. of Germany

[21] Appl. No.: 730,590

[22] Filed: Jul. 15, 1991

Related U.S. Application Data

[63] Continuation of Ser. No. 536,171, Jun. 11, 1990, abandoned.

[30] Foreign Application Priority Data

Jun. 20, 1989 [DE] Fed. Rep. of Germany ....... 3920134

[51] Int. Cl.⁵ .............................................. C30B 23/00
[52] U.S. Cl. .................................. 156/603; 156/610; 156/613; 156/DIG. 64; 156/DIG. 68
[58] Field of Search ....... 156/603, 610, 613, DIG. 64, 156/DIG. 68

[56] References Cited

U.S. PATENT DOCUMENTS

| | | | |
|---|---|---|---|
| 2,854,364 | 9/1958 | Lely | 156/DIG. 68 |
| 3,359,077 | 12/1967 | Arst | 156/DIG. 64 |
| 4,147,572 | 4/1979 | Vodakov et al. | 437/100 |
| 4,298,423 | 11/1981 | Lindmayer | 156/DIG. 64 |
| 4,623,425 | 11/1986 | Suzuki et al. | 156/DIG. 64 |
| 4,756,895 | 7/1988 | Boecker et al. | 156/DIG. 64 |

FOREIGN PATENT DOCUMENTS

| | | | |
|---|---|---|---|
| 2128912 | 6/1987 | Japan | 156/DIG. 64 |
| 2128913 | 6/1987 | Japan | 156/DIG. 64 |

*Primary Examiner*—Robert Kunemund
*Assistant Examiner*—Felisa Garrett
*Attorney, Agent, or Firm*—Kenyon & Kenyon

[57] ABSTRACT

Single crystals of silicon carbide (SiC) can be manufactured by subliming and partially decomposing a base material of crystalline silicon carbide powder and by growing the single crystals from seed crystals. According to the present invention, an excess of silicon is added to the silicon carbide base material. Using this technique, high purity, single-crystal silicon carbide is obtained.

6 Claims, No Drawings

METHOD FOR MANUFACTURING SINGLE-CRYSTAL SILICON CARBIDE

This application is a continuation of application Ser. No. 07/536,171, filed Jun. 11, 1990 now abandoned.

FIELD OF THE INVENTION

The present invention relates to a method for manufacturing single-crystal silicon carbide (SiC) by subliming and partially decomposing crystals of industrial silicon carbide powder. Using this method, single crystals of silicon carbide are grown on a seed crystal in a reaction vessel having a protective atmosphere and a small temperature gradient.

BACKGROUND OF THE INVENTION

Single-crystal silicon carbide can be manufactured according to the Lely method by means of sublimation without the use of seed crystals. This technique allows silicon carbide to grow from a partially dissociated compound in an atmosphere enriched in carbon and silicon. Using this method, industrial silicon carbide is decomposed and single-crystal silicon carbide is grown at an elevated temperature of about 2500° C.

According to a modified Lely method, as generally disclosed in DE-PS 32 30 727, single crystals of silicon carbide can be grown from the gas phase on seed crystals of silicon carbide at temperatures of 2100° to 2300° C. This technique results in a temperature gradient that is less than 25° C./cm in the reaction vessel in the direction of growth. In addition, the partial pressure of the protective atmosphere is adjusted during crystal growth so that it is at least equal to the sum of the partial pressures of the components.

The industrial silicon carbide powder used in these methods is typically manufactured according to the Acheson method, generally described in *Philips Research Reports*, Vol. 18, No. 3, June, 1963, pp. 171-174. In this technique, a mixture of silicon dioxide ($SiO_2$), carbon, and other additives are placed in a crucible and heated in an oven to a temperature of 2700° C. A graphite core arranged in the middle of the crucible is used as a heating element. By adding salt, various impurities are converted into gaseous chlorides, which subsequently escape from the silicon carbide. This process produces relatively pure silicon carbide.

This industrial silicon carbide powder, however, is not pure enough for electronic components since it still contains traces of impurities such as heavy metal silicides or carbides. These impurities are not uniformly dispersed throughout the silicon carbide, but instead are retained as impurity clusters in a second phase. When single crystals are subsequently manufactured, impurities, whose solubility limit has been exceeded in the crystal, can be precipitated. The silicon carbide powder used as a base material for single crystal growth should, therefore, undergo yet another chemical purification step to lower the concentration of impurities.

To chemically purify the industrial silicon carbide powder used as a base material, acid or alkaline solutions can be applied. One such solution comprises a mixture of hydrofluoric acid (HF) and nitric acid ($HNO_3$). After being purified, the silicon carbide is rinsed in a liquid that is free of acid and alkaline components, preferably water. The base material is then dried, preferably by heating in a high vacuum.

SUMMARY OF THE INVENTION

The method of the present invention enables the production of high purity, single-crystal silicon carbide. The present invention is an improvement over current methods for growing single-crystal silicon carbide on a seed crystal from the gas phase. This improvement is based on the discovery that an excess of silicon must be available for optimal crystal growth. An embodiment of the present invention provides a method for the manufacture of single-crystal silicon carbide by subliming and partially decomposing crystalline silicon carbide powder having an excess of silicon. Single crystals are then grown from seed crystals in a reaction vessel having a protective atmosphere and a small temperature gradient.

DETAILED DESCRIPTION

The present invention provides a method for the manufacture of single-crystal silicon carbide from crystalline silicon carbide powder in a reaction vessel having a protective atmosphere and a small temperature gradient in the direction of crystal growth. When highly purified silicon carbide (i.e., with an impurity concentration of less than about 100 ppm) is used to manufacture the single-crystal silicon carbide, elemental silicon can be added immediately before crystal growth. However, when industrial silicon carbide powder is used as a base material, it must undergo a purification step before crystal growth. In this instance, elemental silicon is added after the purification step. During the purification step, free silicon or silicon oxide can be released and, as a result, the composition of the gas phase (e.g., Si, $Si_2C$, $SiC_2$) may be altered. Thus, the stoichiometry of the growing crystal may also be altered and crystal growth impeded. By supplying additional elemental silicon before crystal growth, pure single crystals of silicon carbide can be obtained with lengths of up to several centimeters. Preferably, 0.1 to 5 % and most preferably, about 1 to 2 % excess silicon is added. For example, the elemental silicon can be added in a powder form having more or less the same granular size as the silicon carbide powder, whose granular size can be on the order of 10 to 100 um. The elemental silicon can also be added with a relatively large granular size (e.g., up to about 500 um) or even as a whole piece, such as a wafer.

Another way to provide excess silicon for crystal growth is to include additional silicon in the manufacture of the silicon carbide powder used as a base material. This means, for example, combining silicon and carbon such that the molar Si:C ratio is greater than 1.

The increased purity of the single crystals produced using the present invention is apparent from their greater transparency and from their lack of marked optical inhomogeneities. The increased purity of the single crystals is also evident from their improved electronic properties, e.g., an increase in charge carrier mobility.

What is claimed is:

1. A method for the growth of single-crystal silicon carbide in a reaction vessel having a protective atmosphere and a small temperature gradient in the direction of growth, comprising:

adding excess silicon to a crystalline silicon carbide powder;

subliming and partially decomposing the crystalline silicon carbide powder; and growing, on a seed crystal, single crystals of silicon carbide from the sublimed and partially decomposed crystalline silicon carbide powder;

wherein said excess silicon is in an amount of from about 0.1% to 5%.

2. The method for the manufacture of single-crystal silicon carbide as recited in claim 1, wherein the crystalline silicon carbide powder is manufactured from highly-purified silicon.

3. The method for the manufacture of single-crystal silicon carbide as recited in claim 1, wherein the crystalline silicon carbide powder is industrial silicon carbide and the method further comprises purifying the industrial silicon carbide before adding the excess silicon.

4. The method for the manufacture of single-crystal silicon carbide as recited in claim 1, wherein the excess silicon is added in a finely dispersed form.

5. The method for the manufacture of single-crystal silicon carbide as recited in claim 1 wherein the crystalline silicon carbide powder has a molar Si:C ratio greater than 1.

6. The method for the manufacture of single-crystal silicon carbide as recited in claim 1, wherein said excess silicon is in an amount of from about 1% to 2%.

* * * * *